United States Patent [19]

Olschewski

[11] 4,152,660
[45] May 1, 1979

[54] ISOLATION AMPLIFIER

[75] Inventor: Wilfred W. Olschewski, Tucson, Ariz.

[73] Assignee: Burr-Brown Research Corporation, Tucson, Ariz.

[21] Appl. No.: 891,552

[22] Filed: Mar. 30, 1978

[51] Int. Cl.² .............................................. H03F 3/38
[52] U.S. Cl. .................................................. 330/10
[58] Field of Search ....................................... 330/9, 10

[56] References Cited
U.S. PATENT DOCUMENTS

| 4,030,041 | 6/1977 | Sasaki .................................. 330/10 |
| 4,066,974 | 1/1978 | Reinhard ............................. 330/10 |

*Primary Examiner*—James B. Mullins
*Attorney, Agent, or Firm*—Harry M. Weiss

[57] ABSTRACT

This relates to a transformer coupled isolation amplifier employing multiple primary and secondary windings to separate power supply currents from signal currents. An input section includes an input amplifier, a flyback modulator and a first flyback demodulator. An output section includes an output amplifier and a second flyback demodulator. A power section alternately provides a voltage and a high impedance to the transformer, which voltage is coupled to the input and output amplifiers via first and second primary and first and second secondary windings respectively for the purpose of providing positive and negative power sources to the amplifiers. The input demodulator is coupled to the output demodulator by third primary and secondary windings.

10 Claims, 2 Drawing Figures

ISOLATION AMPLIFIER

BACKGROUND OF THE INVENTION

1. Field of the Invention

This invention relates generally to isolation amplifiers, and more particularly, to a transformer isolated amplifier employing multiple primary and secondary windings.

2. Description of the Prior Art

Isolation amplifiers are employed, for example, whenever it is necessary to measure low level signals in the presence of high common mode voltages so as to eliminate errors caused by disturbances on a common ground network, to avoid ground loops and inherent pick-up problems and to protect processing circuitry from damage by large common mode input and output voltage levels.

Transformer coupled isolation amplifiers commonly employed at least two transformers, one for coupling a carrier signal to an isolated input modulator and to provide power to an isolated input amplifier, and the other for coupling a modulated signal from the isolated input to a demodulator in the output section. Such an arrangement is shown and described in U.S. Pat. No. 3,754,193. However, using such an approach presents considerable difficulties in reducing the size, complexity, weight and cost of the amplifier along with a corresponding reduction in the reliability of the amplifier's operation.

To overcome some of these difficulties, isolation amplifiers have been designed which employ a single transformer to provide both an amplifier signal path and an energy path.

One such arrangement is shown and described in U.S. Pat. No. 3,988,690. An input amplifier stage is isolated from the main body of an amplifier by a single transformer having first and second primary windings and a secondary winding. The transformer provides both an energy path to the input stage and an amplifier signal path from the input stage using a modulated load technique. The secondary of the transformer is coupled across the input amplifier and includes a rectifier and filtering components which provide a floating D.C. voltage supply. The transformer rectifies the power on the secondary, and the power drain is modulated. Changes in current on the primary are monitored and used to detect the amplifier signal.

While this is a satisfactory arrangement with respect to modulating power, it does not represent an efficient and accurate way of separating power from the input signal since the zero offset point is load sensitive and varies with the "Q" of the transformer. Thus, this is not a satisfactory approach if D.C. coupling and accurate D. C. stability are important considerations.

An isolation amplifier arrangement shown and described in U.S. Pat. No. 4,066,974 represents a marked improvement with respect to D.C. stability. In this arrangement, an alternator coupled to a single secondary winding of a transformer alternately presents a voltage and a high impedance to the secondary winding. A first switching device couples the output of an input amplifier to a single primary winding when a high impedance is presented to the secondary winding. A second switching device couples the input of an output amplifier to the secondary winding when a high impedance is presented to the secondary winding.

Since an inductor cannot change current instantaneously, the voltage on the winding reverses in order to maintain its current each time a high impedance is presented to the secondary winding. Thus, the overall result of each voltage/high-impedance cycle is a positive power pulse having a trailing negative flyback pulse. It is this flyback pulse that is modulated with the input signal on the input side and then demodulated on the output side to yield the signal.

This arrangement suffers, however, from the disadvantage that power drawn the primary winding interferes with the amplitude of the negative flyback signal pulse; i.e. voltage drops in the primary winding alter the signal flyback portion.

This arrangement has additional disadvantages. Firstly, the arrangement employs a single flyback demodulator wherein a flyback rectifier places a negative voltage on a comparator. In order to get a voltage swing around zero volts, a resistor coupled to a positive voltage supply is used to buck out some of the negative voltage. This renders the output signal very sensitive to supply voltage variations; i.e. poor power supply rejection.

Secondly, this arrangement employs a complex scheme for producing the required positive and negative supply voltages using a single winding. The thus produced supply voltages are not very stable and result in interference with the actual signal.

SUMMARY OF THE INVENTION

It is an object of the present invention to provide a highly accurate isolation amplifier by separating the power supply currents from the signal currents.

A features of the invention resides in the use of separate power and signal windings to isolate power supply loading from the signal thus improving D.C. offset, gain accuracy and linearity characteristics.

It is a further object of the invention to isolate the transformer energization function from the modulation and demodulation functions thus permitting a three-port arrangement. This is accomplished by providing separate input, output and power sections.

It is a still further object of the present invention that the isolation amplifier be provided with means to substantially reduce errors in the modulation function. This is accomplished by using two flyback demodulators, one in a closed feedback loop with an input amplifier. The output from this first flyback demodulator is compared with the amplifier input signal, and if a difference is detected, the modulation amount is appropriately corrected.

It is still another object of the invention that the inventive isolation amplifier have improved power supply rejection over that of prior art devices.

According to a broad aspect of the invention there is provided an isolation amplifier, comprising: a transformer having a plurality of windings; generating means for imparting a waveform onto said transformer, said waveform having a signal portion and an energization portion; an input section for receiving an electrical input signal and modulating said signal portion with said electrical input signal; first means coupled to said input section and to at least a first one of said plurality of windings for deriving power from said energization portion; an output section inductively coupled to said input section by at least a second one of said plurality of windings for demodulating the modulated signal portion; and second means coupled to said output section and to at least a third one of said plurality of windings for deriving power from said energization portion.

The foregoing and other objects, features, and advantages of the invention will be apparent from the following, more detailed, description of preferred embodiments taken in conjunction with the accompanying drawings in which:

DESCRIPTION OF THE PREFERRED EMBODIMENT

Figure 1:
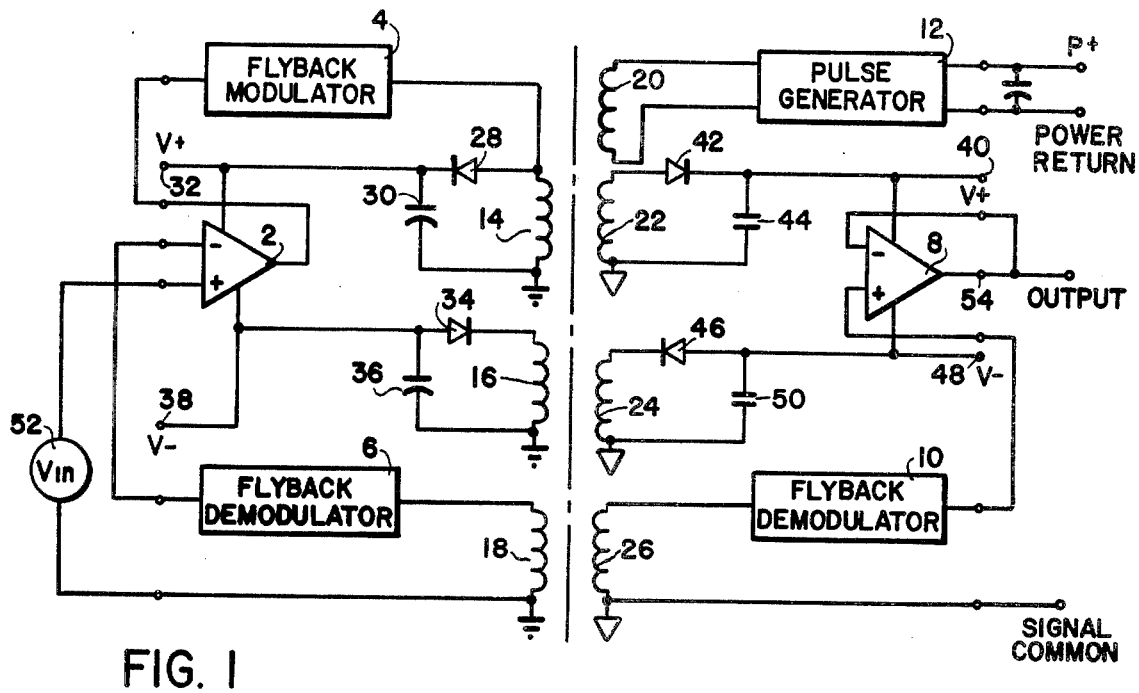
FIG. 1 is a partial block diagram of an isolation amplifier according to the present invention.

FIG. 1 is a partial block diagram of the inventive isolation amplifier which may be described as comprising an input section, an output section and a power section. The input section includes input amplifier 2, flyback modulator 4 and flyback demodulator 6. The output section includes output amplifier 8 and flyback demodulator 10, and the power section includes pulse generator 12. The transformer employed in the arrangement shown in FIG. 1 comprises primary windings 14, 16 and 18, and secondary windings 20, 22, 24 and 26.

Pulse generator 12 produces a rectangular pulse of a predetermined duration and repetition rate by alternately presenting a voltage and an open circuit to the transformer. Each pulse typically has an amplitude of 15 volts and a duration of 250 nanoseconds. For reasons previously discussed, a negative flyback pulse is also produced on winding 20. This process of energizing the transformer is utilized to derive the power required on both the input and output sides of the isolation amplifier. That is, the rectangular pulse, which is positive in primary winding 14 is rectified by diode 28 and, in combination with capacitor 30, provides a positive supply voltage (V+) to input amplifier 2 and to terminal 32. The rectangular pulse which is negative in primary winding 16, is rectified by diode 34 which, in combination with capacitor 36, provides a negative supply voltage (V−) to input amplifier 2 and to terminal 38.

In a similar manner, the positive supply voltage V+ is produced and applied to output amplifier 8 and terminal 40 by secondary winding 22, diode 42 and capacitor 44. Likewise, the negative supply voltage V− is produced and applied to output amplifier 8 and to terminal 48 by secondary winding 24, diode 46 and capacitor 50.

The output of amplifier 2, having an input supplied by source 52, is coupled to the input of flyback modulator 4 which presents a varying load to the negative flyback pulse appearing on primary winding 14. The load variation is dependent upon the voltage amplitude applied to the input of modulator 4 from the output of amplifier 2.

The modulated flyback signal is then applied to the input of two substantially identical flyback demodulators 6 and 10 via windings 18 and 26 respectively. The output of demodulator 6 is applied to the minus input of amplifier 2. In this manner, the demodulated flyback signal is compared with the input signal. The gain of amplifier 2 will alter the amount of modulation in a direction so as to render the amplitude of the demodulated flyback signal (from demodulator 6) substantially equal to the input signal applied to the plus input of amplifier 2.

Output flyback demodulator 10 is chosen to be substantially identical to input flyback demodulator 6. Thus, the same signal will be generated at the output of demodulator 10 as was generated by demodulator 6, yielding a high degree of accuracy.

The output of flyback demodulator 10 is applied to the plus input of output amplifier 8, the output of which is coupled back into its minus input thus producing a unity gain follower circuit. The isolation amplifier output appears at terminal 54.

As examples of suitable amplifiers 2 and 8, reference is made to Motorola's MC 1456 and National Semiconductor's LM4250.

Figure 2:
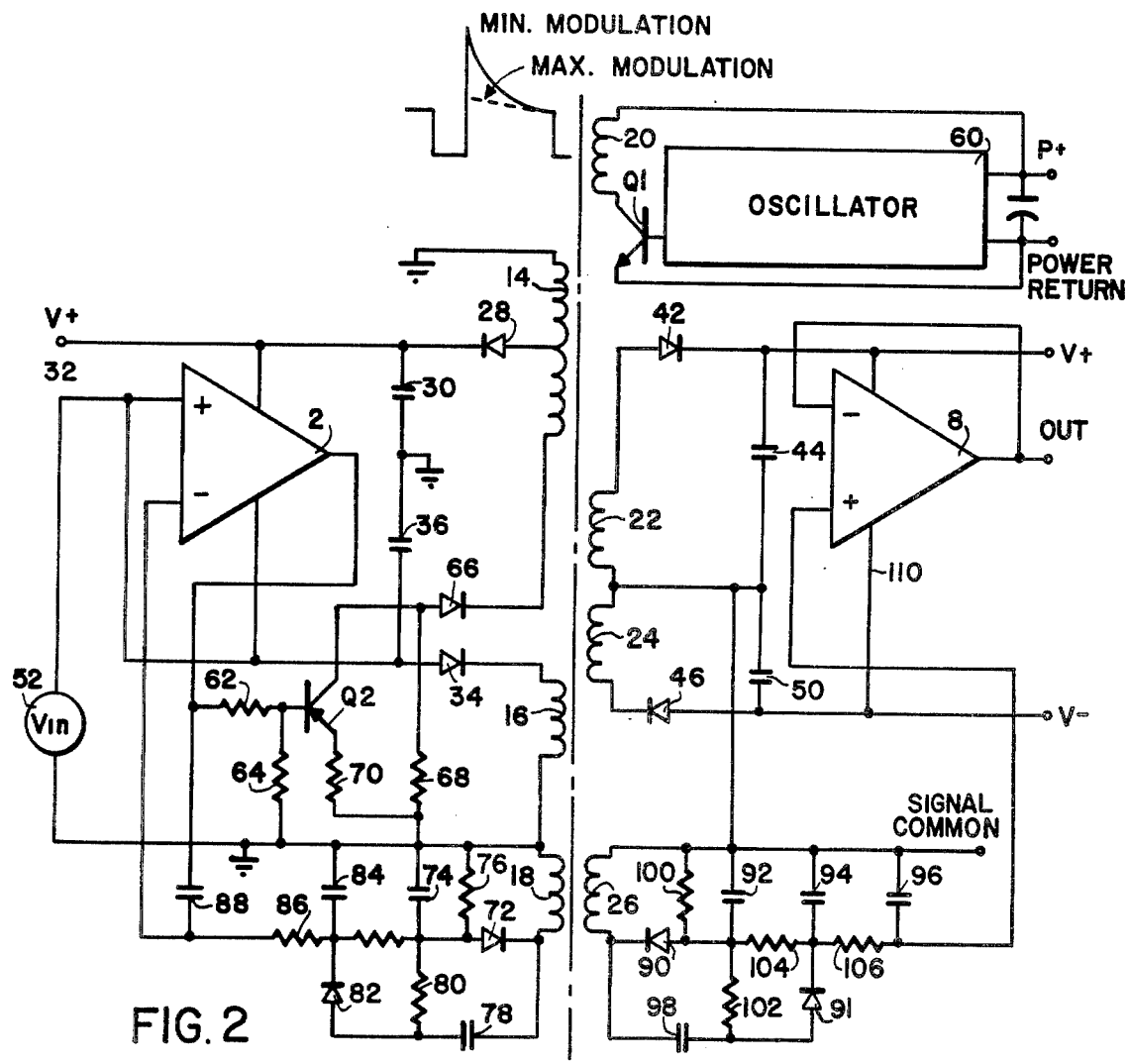
FIG. 2 is a schematic diagram of the isolation amplifier shown in FIG. 1.

Referring now to FIG. 2 which is a schematic diagram of an isolation amplifier according to the present invention, the output of an oscillator 60 is coupled to the base of switching transistor Q1. The collector of Q1 is coupled to winding 20 of the transformer, which winding is in turn coupled to the P+terminal of a source of power. The emitter of Q1 is coupled to the P−terminal of the power source. When a positive pulse is applied to the base of Q1, a negative voltage having an amplitude of approximately P+(typically 15 volts) is applied across winding 20. When Q1 becomes non-conductive, the voltage across winding 20 reverses polarity and then decays back towards zero volts thus producing the above referred to flyback pulse. The resulting waveform is shown adjacent winding 20 in FIG. 2. This energization of the transformer results in the production of the positive and negative power signals on both the input and output sides of the isolation amplifier. That is, on the input side V+is produced by winding 14, diode 28 and capacitor 30, and V−is produced by winding 16, diode 34 and capacitor 36. On the output side, V+is produced by winding 22, diode 42 and capacitor 44, and V−is produced by winding 24, diode 46 and capacitor 50.

Modulator 4 (FIG. 1), into which the output of amplifier 2 is coupled, consists of a voltage divider (resistors 62 and 64), modulating transistor Q2, and modulating diode 66. Resistor 68 provides the minimum load necessary under all circumstances to prevent ringing and high impedance problems. Resistor 70, coupled to the emitter of PNP transistor Q2 acts as a stabilizing resistor reducing modulator gain to prevent oscillations.

As the voltage on the base of Q2 becomes more negative, the load presented to winding 14 becomes greater. Whenever a negative pulse appears at diode 66 (the flyback pulse on winding 14 will always be negative), it will be loaded down in proportion to the amount of negative voltage on the base of Q2.

The base of modulating transistor is coupled via resistor 62 to the output of amplifier 2. If, for example, an input signal is coupled to the plus input of amplifier 2 and the minus input is at ground, the output of amplifier 2 will be positive and modulating transistor Q2 will be shut off resulting in no significant attenuation of the flyback amplitude (except for the loading caused by resistor 68 and internal losses of the transformer). If now a negative input is applied to amplifier 2, its output will be negative turning modulating transistor Q2 on presenting a load of, for example, 1 KΩ to winding 20 thus attenuating the flyback amplitude. If a 15 volt power supply were employed, the flyback pulse would have a peak amplitude of approximately 25 volts when the modulator is off and a peak amplitude of approximately 15 volts when the modulator is fully turned on.

Next, the flyback amplitude is demodulated in two substantially identical demodulators 6 and 10 (FIG. 1). Since they are substantially identical, only the demodulator on the input side will be described in detail with reference to FIG. 2.

Winding 18 sees a negative energization pulse and a positive flyback pulse. The negative energization pulse is rectified by diode 72 and is filtered out by capacitor 74. Resistor 76 provides the minimum load required. Next, the voltage on the transformer is shifted to swing around a negative voltage which occurs across capacitor 74. This is accomplished by coupling capacitor 78 and resistor 80 which is referenced to the voltage across capacitor 74. That is, the average transformer voltage is shifted by the amplitude of the energization pulse. The result is then rectified by diode 82. If the amplitude of the flyback pulse is greater than that of the energization pulse, a positive output will appear across capacitor 84. If the amplitude of the flyback pulse is less than that of the energization pulse, a negative output will appear. Resistor 86 works in conjunction with capacitor 88 to stabilize the closed loop modulation/demodulation system and filter the demodulated output.

The output demodulator operates in the same manner and includes diodes 90 and 91, capacitors 92, 94, 96 and 98 and resistors 100, 102, 104 and 106.

The output of the input flyback demodulator is coupled to the minus input of amplifier 2, either directly or, if gain is desired, through a voltage divider. If now, for example, a five volt signal is applied to the plus input of amplifier 2, the amplitude will apply a voltage to the base of transistor Q2 until such time as the demodulator output equals five volts thus resulting in a stable condition in the feedback loop. Since the output demodulator is substantially identical to the input demodulator, a five volt signal will appear at the output of the output flyback demodulator which is coupled to the plus input of amplifier 8. The minus input of amplifier 8 is coupled to its output.

From the above description, it should be apparent that there is presented an isolation amplifier having improved accuracy, D.C. offset and linearity characteristics. This was accomplished by using separate power and signal coils to isolate the power supply currents from the signal currents. Further, errors in the modulation process have been substantially reduced by employing input and output flyback demodulators which are matched to each other.

While the invention has been particularly shown and described with reference to preferred embodiments thereof, it will be understood by those skilled in the art that the foregoing and other changes in form and details may be made therein without departing from the spirit and scope of the invention.

What is claimed is:
1. An isolation amplifier, comprising:
a transformer having a plurality of windings;
generating means for imparting a waveform onto said transformer, said waveform having a signal portion and an energization portion;
an input section for receiving an electrical input signal and modulating said signal portion with said electrical input signal;
first means coupled to said input section and to at least a first one of said plurality of windings for deriving power from said energization portion;
an output section inductively coupled to said input section by at least a second one of said plurality of windings for demodulating the modulated signal portion; and
second means coupled to said output section and to at least a third one of said plurality of windings for deriving power from said energization portion.
2. An isolation amplifier according to claim 1 wherein said input section comprises:
input amplifier means for amplifying said electrical signal, said input amplifier means having input, output and power supply terminals, one of said input terminals coupled to receive said electrical input signal; and
modulating means coupled to the output of said input amplifier means, the output of said modulating means inductively coupled to said transformer.
3. An isolation amplifier according to claim 2 wherein said output section comprises:
output amplifier means having input, output and power supply terminals; and
second demodulating means having an input coupled to said at least a second one of said plurality of windings for demodulating the modulated signal portion and having an output coupled to an input of said output amplifier means.
4. An isolation amplifier according to claim 3 wherein said first means includes:
first rectifying means coupled to said transformer and to said input amplifier means for producing a positive supply voltage; and
second rectifying means coupled to said transformer and to said input amplifier means for producing a negative supply voltage.
5. An isolation amplifier according to claim 4 wherein said second means includes:
third rectifying means coupled to said transformer and to said output amplifier means for producing a positive supply voltage; and
fourth rectifying means coupled to said transformer and to said output amplifier means for producing a negative supply voltage.
6. An isolation amplifier according to claim 5 wherein said generating means comprises:
an oscillator; and
a transistor having base, emitter and collector terminals, said base terminal coupled to the output of said oscillator, said collector terminal coupled to a fourth one of said plurality of windings, said emitter terminal and an opposite end of said fourth one of said plurality of windings for receiving a source of supply voltage.
7. An isolation amplifier according to claim 3 further including first demodulating means having an output coupled to another input of said input amplifier means and having an input inductively coupled to the output of said modulating means through a fifth one of said plurality of windings.
8. An isolation amplifier according to claim 7 wherein said first and second demodulating means are substantially identical.
9. An isolation amplifier comprising:
a transformer having a plurality of windings;
generating means for imparting a waveform onto said transformer, said waveform having a signal portion and an energization portion;
an input section for receiving an electrical input signal and modulating said signal portion with said electrical input signal;
first means coupled to said input section and to at least a first one of said plurality of windings for deriving power from said energization portion;

an output section inductively coupled to said input section by at least a second one of said plurality of windings for demodulating the modulated signal portion;

second means coupled to said output section and to at least a third one of said plurality of windings for deriving power from said energization portion; and first demodulating means having an output coupled to said input section and having an input coupled to said transformer for demodulating the output of said input section, said input section comparing the demodulated signal portion with said electrical input signal.

10. An isolation amplifier comprising:
a transformer having a plurality of windings;

generating means for imparting a waveform onto said transformer, said waveform having a signal portion and an energization portion;

an input section for receiving an electrical input signal and modulating said signal portion with said electrical input signal;

first means coupled to said input sectin and to at least a first one of said plurality of windings for deriving power from said energization portion;

an output section inductively coupled to said input section by at least a second one of said plurality of windings for demodulating the modulated signal portion; and first demodulating means having an output coupled to said input section and having an input coupled to said transformer, said input section comparing the demodulated signal portion with said electrical input signal.

* * * * *